(12) United States Patent
Tanaka et al.

(10) Patent No.: US 9,178,055 B2
(45) Date of Patent: Nov. 3, 2015

(54) SEMICONDUCTOR DEVICE

(71) Applicant: Sanken Electric Co., LTD., Niiza-shi, Saitama (JP)

(72) Inventors: Yuki Tanaka, Niiza (JP); Toru Yoshie, Niiza (JP); Mikio Kandori, Niiza (JP); Yusuke Ozawa, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/496,808

(22) Filed: Sep. 25, 2014

(65) Prior Publication Data
US 2015/0091082 A1  Apr. 2, 2015

(30) Foreign Application Priority Data

Sep. 30, 2013  (JP) ................. 2013-204889

(51) Int. Cl.
| H01L 27/108 | (2006.01) |
| H01L 29/76 | (2006.01) |
| H01L 29/94 | (2006.01) |
| H01L 31/119 | (2006.01) |
| H01L 29/78 | (2006.01) |
| H01L 29/417 | (2006.01) |
| H01L 29/45 | (2006.01) |

(52) U.S. Cl.
CPC ...... H01L 29/7802 (2013.01); H01L 29/41741 (2013.01); H01L 29/41766 (2013.01); H01L 29/45 (2013.01)

(58) Field of Classification Search
CPC ............ H01L 29/66666; H01L 29/7788; H01L 29/7827; H01L 29/8083; H01L 29/8122
See application file for complete search history.

(56) References Cited

U.S. PATENT DOCUMENTS

| 5,428,229 | A | 6/1995 | Niwayama et al. |
| 8,373,176 | B2 | 2/2013 | Tamaso |
| 2010/0025759 | A1* | 2/2010 | Yoshimochi ........... 257/330 |
| 2011/0031506 | A1 | 2/2011 | Tamaso |
| 2011/0031507 | A1 | 2/2011 | Tamaso |
| 2011/0073906 | A1 | 3/2011 | Bobde et al. |
| 2012/0037922 | A1 | 2/2012 | Kono et al. |

FOREIGN PATENT DOCUMENTS

| JP | H04-322471 A | 11/1992 |
| JP | 2010-238738 A | 10/2010 |
| WO | 2009/128382 A1 | 10/2009 |

OTHER PUBLICATIONS

Aug. 25, 2015 —(JP) Office Action—App 2013-204889.

* cited by examiner

Primary Examiner — Hoai V Pham
(74) Attorney, Agent, or Firm — Banner & Witcoff, Ltd.

(57) ABSTRACT

A semiconductor device includes a semiconductor substrate, a surface of which is provided with: a source region having a first conductivity type is formed in a body region having a second conductivity type opposite to the first conductivity type; a main electrode connected to the source region and the body region; and a gate electrode, to which a voltage for controlling a current flowing through the main electrode is applied, and the semiconductor device includes: a recess formed in the surface of the semiconductor substrate, wherein the source region is exposed on an inner surface of the recess and the main electrode is connected to the source region at the inner surface of the recess.

6 Claims, 8 Drawing Sheets

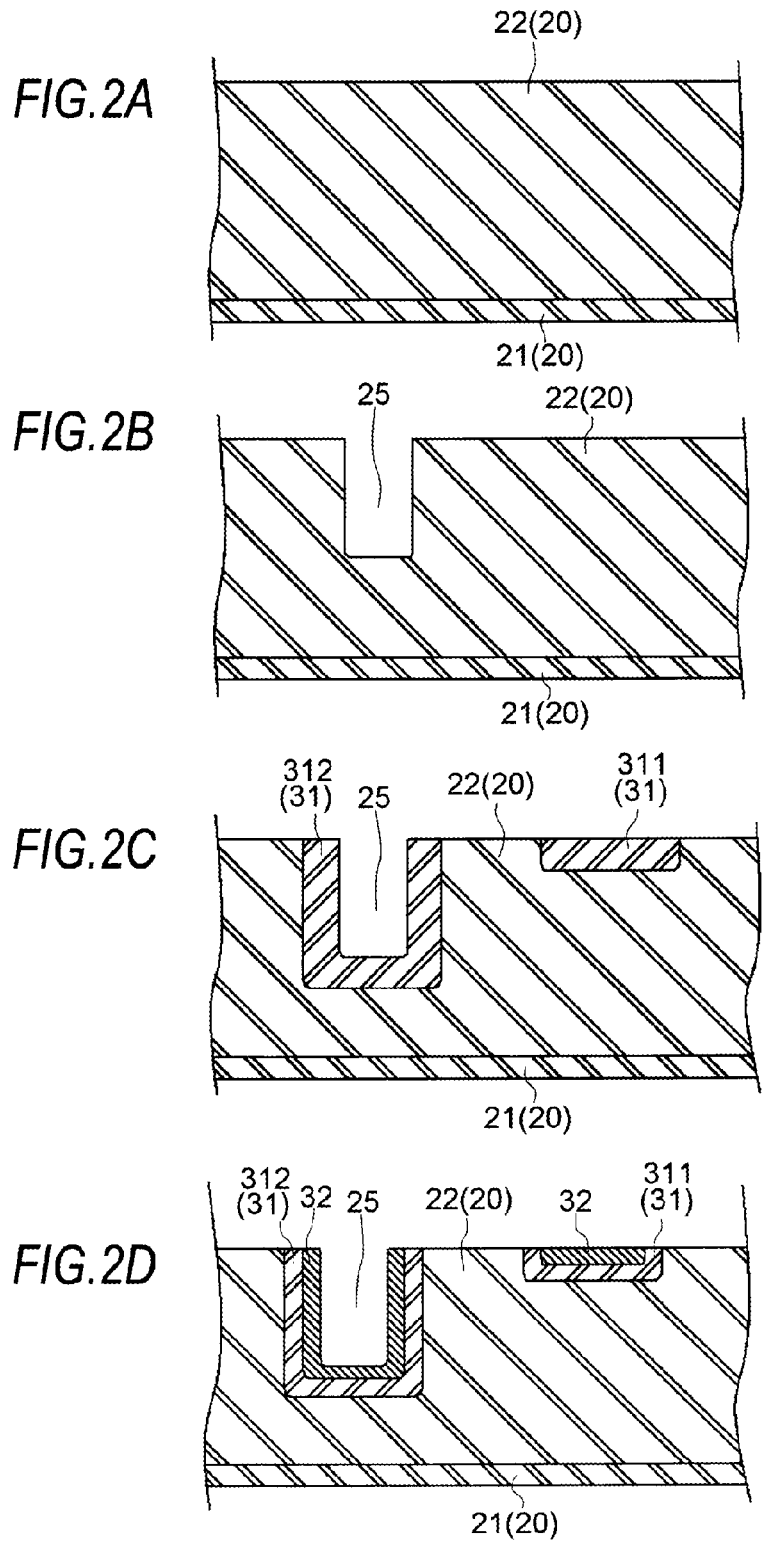

SEMICONDUCTOR DEVICE

CROSS-REFERENCE TO RELATED APPLICATION

This application claims priority from Japanese Patent Application No. 2013-204889 filed on Sep. 30, 2013, the entire subject matter of which is incorporated herein by reference.

TECHNICAL FIELD

This disclosure relates to a structure of a semiconductor device having a main electrode formed on a surface of a semiconductor substrate.

BACKGROUND ART

A DMOS (Double Diffused MOSFET) structure is adopted as a structure of a power MOSFET that is used as a power semiconductor device. In the DMOS structure, a semiconductor substrate having an n-type layer (an epitaxial layer) formed on an $n^+$-type substrate configured to function as a drain is used. A p-type layer to be a body region is locally formed on a surface of the n-type layer by an ion implantation and the like. Also, an $n^+$-type layer to be a source region is locally formed in the p-type layer on the surface. A switching (on-and-off) of a channel in the body region just below a gate electrode adjacent to the $n^+$-type layer to be a source region is controlled by a voltage applied to the gate electrode, so that a switching operation is performed. The MOSFET having the above configuration is disclosed in WO 2009/128382. The semiconductor substrate is made of Si or silicon carbide (SiC). In any case, it is possible to obtain a power semiconductor device having the same structure although the manufacturing processes thereof are different.

Without being limited to the technology disclosed in WO 2009/128382, in the above DMOS structure, a source electrode is formed on the surface, and the source electrode is connected with the source region ($n^+$-type layer) of the surface and the body region (p-type layer). Since a large current flows through the source electrode during an operation, it is necessary to reduce a contact resistance between the source electrode and the $n^+$-type layer, p-type layer. According to the technology disclosed in WO 2009/128382, a material of an electrode directly contacting the same is optimized to reduce the contact resistance.

SUMMARY

As a device is made to be smaller, an area of the $n^+$-type layer to be the source region is reduced. In this case, even when the material of the electrode is optimized, it is difficult to sufficiently reduce the contact resistance because a contact area with the source electrode is reduced. This situation is particularly appeared when the semiconductor substrate is made of SiC.

Accordingly, it is difficult to sufficiently reduce the contact resistance of the source electrode formed on the semiconductor substrate.

In view of the above, this disclosure provides at least semiconductor device having a main electrode formed on a surface of a semiconductor substrate.

Aspects of this disclosure will be described below. A semiconductor device of this disclosure includes a semiconductor substrate, a surface of which is provided with: a source region having a first conductivity type is formed in a body region having a second conductivity type opposite to the first conductivity type; a main electrode connected to the source region and the body region; and a gate electrode, to which a voltage for controlling a current flowing through the main electrode is applied. The semiconductor device includes a recess formed in the surface of the semiconductor substrate, wherein the source region is exposed on an inner surface of the recess and the main electrode is connected to the source region at the inner surface of the recess.

In the above-described semiconductor device, the body region and the source region may be sequentially formed on the inner surface of the recess.

In the above-described semiconductor device, a body-region-connecting region to which the body region and the main electrode are connected may be provided at a position higher than a bottom surface of the recess.

In the above-described semiconductor device, the gate electrode may extend in one direction on the surface of the semiconductor substrate, and the recess and the body-region-connecting region may be alternately provided in a direction parallel with the gate electrode.

In the above-described semiconductor device, the gate electrode may extend in one direction on the surface of the semiconductor substrate, the source region and the body region may be formed on the surface of the semiconductor substrate at both sides perpendicular to the one direction of the gate electrode, and the recess may be formed at one side of both sides perpendicular to the one direction, and the main electrode may be connected to the source region formed in the recess.

In the above-described semiconductor device, a body-region-connecting region to which the body region and the source electrode are connected may be provided on a bottom surface of the recess.

In the above-described semiconductor device, the main electrode and at least one of the source region and the body region may be connected to each other through a silicide electrode.

Since this disclosure is configured as described above, it is possible to sufficiently reduce the contact resistance of the source electrode formed on the surface of the semiconductor substrate.

BRIEF DESCRIPTION OF THE DRAWINGS

The foregoing and additional features and characteristics of this disclosure will become more apparent from the following detailed descriptions considered with the reference to the accompanying drawings, wherein:

FIGS. 2A to 2K are process sectional views illustrating a method of manufacturing the semiconductor device according to the illustrative embodiment of this disclosure;

DETAILED DESCRIPTION

Hereinafter, a semiconductor device according to illustrative embodiments of this disclosure will be described. The semiconductor device is a MOSFET in which a current flowing between a source electrode and a drain electrode is switched (on-and-off control) by a gate electrode formed on a semiconductor substrate. The MOSFET is formed using a semiconductor substrate made of silicon (Si) or silicon carbide (SiC). In the semiconductor device, a source electrode is formed on a surface of the semiconductor substrate and a contact resistance thereof is sufficiently reduced.

Figure 1A:
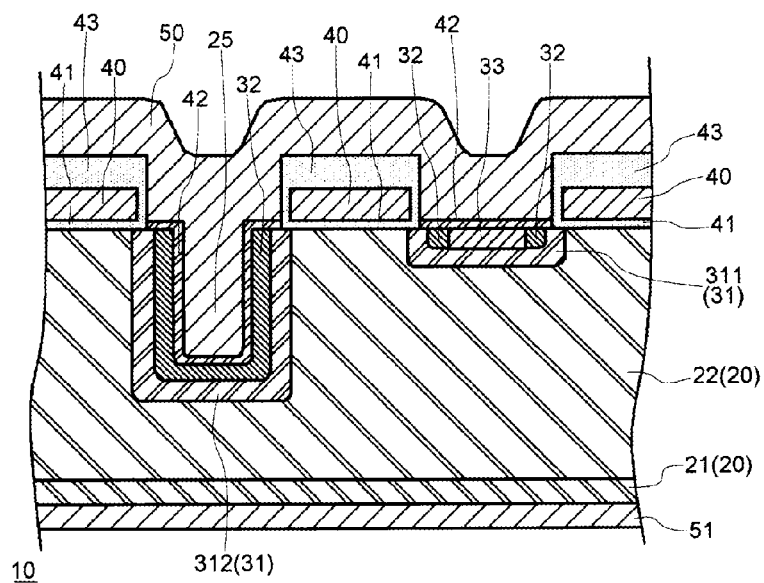
FIG. 1A is a sectional view of a semiconductor device according to an illustrative embodiment of this disclosure and FIG. 1B is a plan view thereof.
Figure 1B:
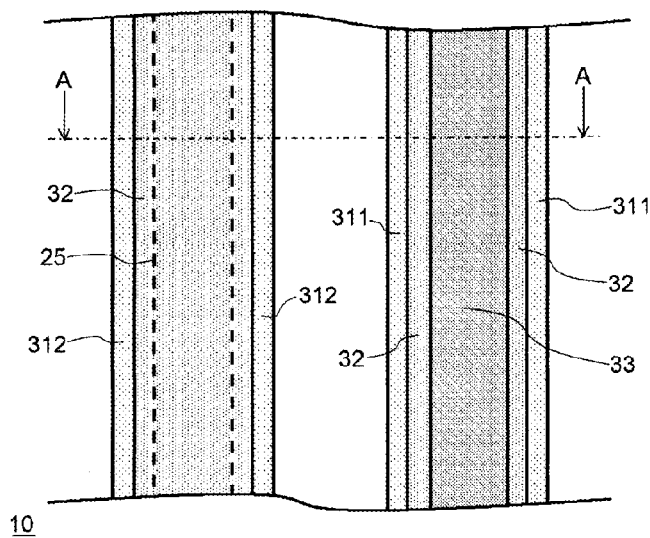

FIGS. 1A and 1B are a sectional view and a plan view, respectively, illustrating a structure of the semiconductor device 10. In the plan view (FIG. 1B), only a configuration in the semiconductor substrate is shown and a gate electrode, a source electrode and the like are not shown. The sectional view of FIG. 1A shows a section as seen in an arrow A-A direction of FIG. 1B.

Here, a semiconductor substrate 20 having an n-type layer 22 formed on an n+-type substrate 21 is used. The semiconductor substrate is made of Si, SiC and the like. Although p-type layers 31 to be a body region are formed at two places in FIG. 1 on a surface of the semiconductor substrate 20, the p-type layers 31 have different shapes. A gate electrode 40 is formed with a gate oxide film 41 being interposed between the two p-type layers 31.

Here, while the p-type layer 311, at right side, is formed on the surface of the semiconductor substrate 20 (the n-type layer 22), similarly to the technology disclosed in WO 2009/128382 and the like, the p-type layer 312, at left side, is formed on an inner surface of a recess 25 formed in the semiconductor substrate 20 (the n-type layer 22). At this time, an n+-type layer 32 to be a source region is formed on surfaces of both the p-type layers 311, 312. Also, a p+-type layer 33 is formed penetrating through the n+-type 32 formed on the right p-type layer 311. The p+-type layer 33 is a body-region-connecting region provided to connect the underlying p-type layer (the body region) 31 and the source electrode (the main electrode).

As shown in FIG. 1B, the recess 25 extends in a direction perpendicular to the paper sheet of FIG. 1A, and the p-type layers 311, 312, the n+-type layer 32, the p+-type layer 33 and the like are formed along the recess. This is also the same for the gate electrode 40 and the gate oxide film 41.

At the right side of the gate electrode 40 at the center of FIG. 1A, a silicide electrode 42 configured to cover the n+-type layer 32 and p+-type layer 33 exposed on the surface of the semiconductor substrate 20 and made of Ni silicide (NiSi) is formed. Also, at the left side of the gate electrode 40, the silicide electrode 42 is formed to cover the n+-type layer 32 exposed on the inner surface (a side surface and a bottom surface) of the recess 25. An upper surface of the gate electrode 40 is covered by an interlayer insulation layer 43 and then a source electrode 50 is formed over an entire surface in FIG. 1. Thereby, the n+-type layer 32 and the p+-type layer 33 formed at the right side of the gate electrode 40 and the n+-type layer 32 formed in the recess 25 at the left side of the gate electrode 40 are connected to the common source electrode (the main electrode) 50. Also, a drain electrode 51 is formed on the n+-type substrate 21 exposed on a backside of the semiconductor substrate 20.

Meanwhile, in an actual semiconductor device, the configuration of FIGS. 1A and 1B is formed in plural in a horizontal direction, and the source electrode 50, the drain electrode 51 and the gate electrode 40 are electrically connected, respectively. To this end, the source electrode 50 and the drain electrode 51 are respectively formed to cover the surface and backside of the semiconductor substrate 20 over a wide range. Also, all the gate electrodes 40 are connected to a common gate wiring and are taken out as independent terminals from the source electrode 50, at a place beyond the shown range, for example, at an end portion in the extending direction of the recess 25 on the surface of the semiconductor substrate 20. The p-type layers 311, 312 are also the same and are connected at a place beyond the shown range, as the common p-type layer 31, like the gate electrode 40.

The above-described structure is configured to function as a MOSFET (a power MOSFET) capable of controlling a current flowing between the source electrode 50 and the drain electrode 51 by applying a voltage to the gate electrode 40. At this time, a channel is formed on surfaces of the right p-type layer 311 and left p-type layer 312 of the gate electrode 40. The current flowing through the channel further flows in a vertical direction along the n-type layer 22. At this time, the silicide electrode 42 is provided, so that a contact resistance with the n+-type layer 32 and the p+-type layer 33 can be lowered.

In the above structure, the p-type layer 312 and the n+-type layer 32 are sequentially formed in the recess 25, and the n+-type layer 32 is exposed on the inner side surface and bottom surface of the recess 25. Therefore, it is possible to increase a contact area of the silicide electrode 42 and the n+-type layer 32. At this time, the contact area can be increased by using the side surface of the recess 25, particularly. Hence, when the recess 25 is deeply formed, it is possible to increase the contact area without enlarging the entire device, thereby reducing the contact resistance.

Here, the n+-type layer (the source region) 32 and the p-type layer (the body region) 31 are connected to the gate electrode 40, and the formation of the recess 25 increases the contact area only for the n+-type layer 32. In general, the large current flows between the source region (the n+-type layer) and the drain electrode in the MOSFET, and a main purpose to connect the source electrode to the p-type layer (the body region) is to control a potential during an operation. Therefore, the above configuration is effective where the large current does not flow through the p-type layer 31 (the p-type layers 311, 312) during the operation and the contact resistance can be reduced only for the n+-type layer 32.

At this time, the n+-type layer 32 to be the source region is formed at both sides of the gate electrode 40. The contact area between the n+-type layer 32 at the left side of the central gate electrode 40 in FIG. 1A and the source electrode 50 is increased but the contact area between the right n+-type layer 32 and the source electrode is not increased. However, since the left n+-type layer 32 and the right n+-type layer 32 are connected to the common source electrode 50, they function as the source region of the MOSFET in the same manner.

Also, in FIG. 1, the p-type layer 31 connected to the source electrode 50 is only the p-type layer 311 via the p+-type layer 33, and the p-type layer 312 is not directly connected to the source electrode 50. However, as described above, since the p-type layer 31 is actually integrated in the semiconductor substrate 20, the potentials of the p-type layers 311, 312 are controlled as the potential of the source electrode 50.

To this end, in the configuration of FIG. 1A, the n+-type layer 32 and the source electrode 50 are electrically connected at the left side of the central gate electrode 40. Also, at the corresponding part, the contact area between the n$^+$-type layer 32 and the source electrode 50 is increased and the silicide electrode 42 is interposed to reduce the contact resistance. On the other hand, the n$^+$-type layer 32 is mainly electrically connected to the p-type layer 31 at the right side of the central gate electrode 40. Also at the corresponding part, the p$^+$-type layer 33 and the silicide electrode 42 are interposed to reduce the contact resistance.

Also, as described above, the operating current flows from the source region (the n$^+$-type layer 32) along the channel below the gate electrode 40 and further flows downwardly along the n-type layer 22. At this time, when the recess 25 is formed, the current path in the n-type layer 22 is narrowed. In contrast, in the above structure, the recess 25 is formed at the left side of the gate electrode 40, so that the contact area between the n$^+$-type layer 32 and the source electrode 50 is increased, the p$^+$-type layer 33 (the body-region-connecting region) is provided at a position higher than the bottom surface of the recess 25 at the right side of the gate electrode 40. Thereby, it is possible to widen the current path in the vertical direction in the n-type layer 22, thereby suppressing an increase in the resistance of the corresponding part.

Like this, according to the above semiconductor device, it is possible to reduce the contact resistance of the source electrode 50, thereby easily performing the large current operation.

In the below, a method of manufacturing the above semiconductor device is described. First, as shown in FIG. 2A, the semiconductor substrate 20 is prepared in which the n-type layer 22 of SiC is formed on the n$^+$-type substrate 21 of SiC by the epitaxial growth. Meanwhile, although it is shown that the n$^+$-type substrate 21 is thinner than the n-type layer 22, the film thicknesses are arbitrarily set.

Then, as shown in FIG. 2B, the recess 25 is formed in the surface of the semiconductor substrate (the n-type layer 22). The recess 25 can be formed by a dry etching using a gas such as $CF_4$, $SF_6$ and the like with a photoresist configured to serve as a mask, and may have a depth of about 1 μm, for example.

Subsequently, as shown in FIG. 2C, the p-type layer 31 (the p-type layers 311, 312) is formed by the ion implantation using a photoresist as a mask. At this time, aluminum (Al) can be used as an ion species, for example, and the energy of about 280 to 700 keV can be used. At this time, a high alignment precision with the recess 25 is required. However, since a used alignment mark is formed as a recess portion on the semiconductor substrate 20 simultaneously with the dry etching of the recess 25, it is possible to increase the alignment precision. After the ion implantation, the photoresist is removed and a heat treatment is performed, so that the p-type layer 31 is formed.

Likewise, as shown in FIG. 2D, the n$^+$-type layer 32 is formed in the p-type layer 31. At this time, the ion implantation is performed using phosphorous (P) ions of the energy of about 70 to 200 keV.

Figure 2E:
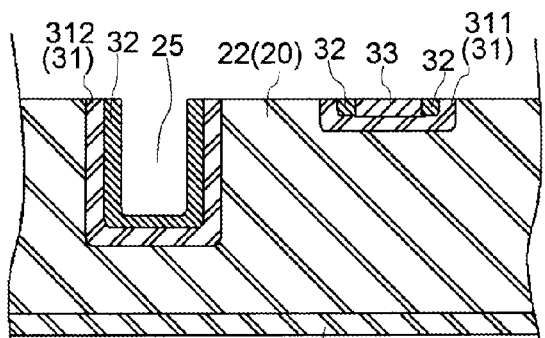

Then, as shown in FIG. 2E, the p$^+$-type layer 33 is formed in the n$^+$-type layer 32 formed in the p-type layer 311 by the ion implantation. This process can be performed in the same manner as that shown in FIG. 2C, except for a mask pattern and an ion dosage. In this case, the dosage is preferably greater than the dosage used for the formation of the p-type layer 31 by double digits or larger.

In the meantime, the sequence of the ion implantation for forming the p-type layer 31 (FIG. 2C), the ion implantation for forming the n$^+$-type layer 32 (FIG. 2D) and the ion implantation for forming the p$^+$-type layer (FIG. 2E) may be changed. Also, the heat treatment may be once performed only after the final ion implantation of the ion implantations is performed. At this time, the temperature is about 1,800° C., for example.

Figure 2F:
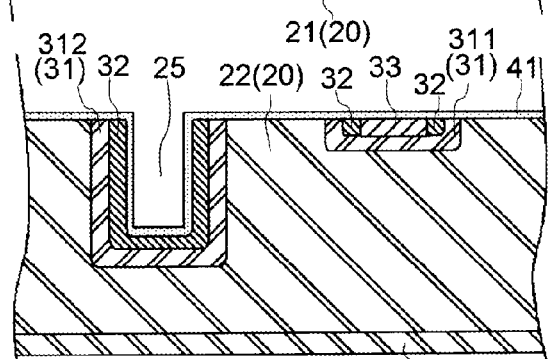

Subsequently, as shown in FIG. 2F, the semiconductor substrate 20 having the shape shown in FIG. 2E is thermally oxidized, so that the gate oxide film 41 made of $SiO_2$ is formed on the surface. A thickness thereof is about 50 nm, for example.

Figure 2G:
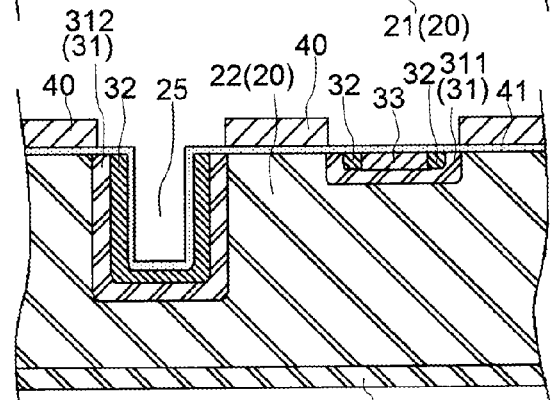

Then, as shown in FIG. 2G, the gate electrode 40 is formed on the gate oxide film 41. For the gate electrode 40, polycrystalline silicon in which phosphorous (P) or boron (B) is heavily doped may be used. After a film of this material is formed on the entire surface by a CVD method and the like, the dry etching using a photoresist as a mask is performed to configure the shape of FIG. 2G.

Figure 2H:
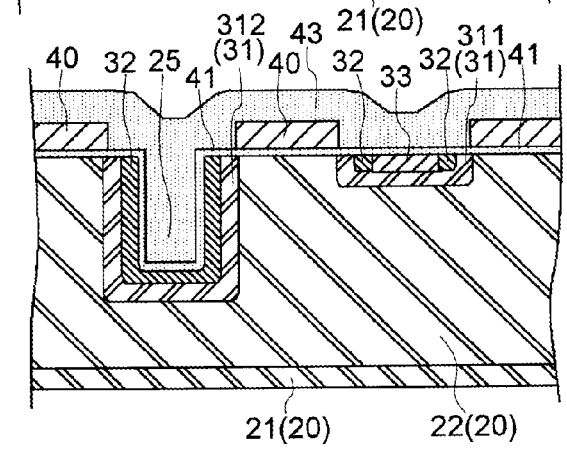

Subsequently, as shown in FIG. 2H, the interlayer insulation layer 43 is formed on the entire surface. For the interlayer insulation layer 43, $SiO_2$ may be used, like the gate oxide film 41. However, the interlayer insulation layer 43 is formed to be thicker than the gate oxide film 41, for example, to have a thickness of about 600 nm by the CVD method and the like.

Figure 2I:
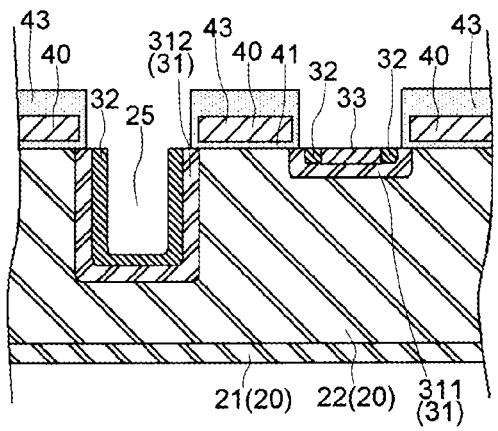

Then, as shown in FIG. 2I, the interlayer insulation layer 43 and the gate oxide film 41 are locally etched to expose the surface of the semiconductor substrate 20, which will contact the source electrode 50. This process can be performed by the dry etching using a gas such as $CHF_3$ with a photoresist configured to serve as a mask. Thereby, the p-type layer 312 and the n$^+$-type layer 32 in the recess 25 are exposed at the left side of the gate electrode 40 and the n$^+$-type layer 32, and the p$^+$-type layer 33 are exposed at the right side of the gate electrode 40.

Figure 2J:
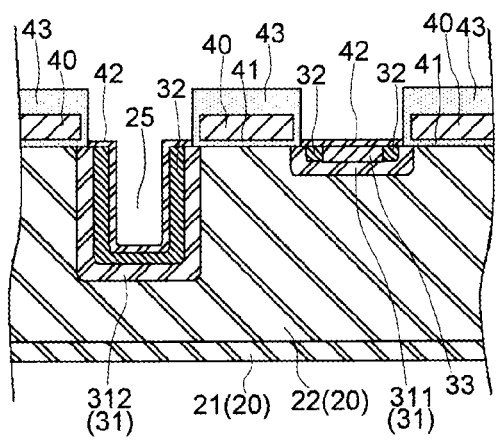

Then, as shown in FIG. 2J, the silicide electrode 42 is formed in the opening of the interlayer insulation layer 43. Actually, after forming a film of a metal material (for example, Ni) to be the silicide electrode 42 without removing the used photoresist in the dry etching in the process of FIG. 2I, it is performed removing the photoresist and then performing a heat treatment causing a silicidization reaction. Thereby, the metal material formed on the place except for the opening of the interlayer insulation layer 43 is removed and the silicide electrode 42 can be formed only at the place except for the opening.

Figure 2K:
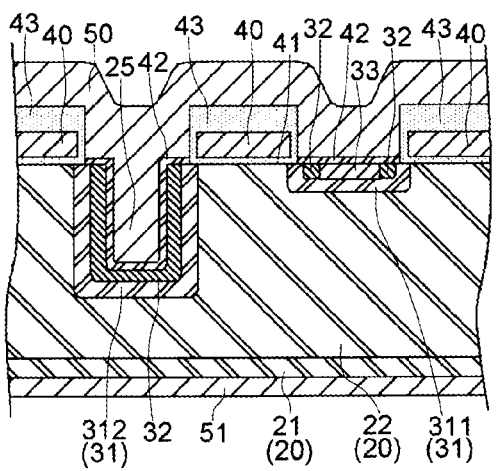

After that, as shown in FIG. 2K, the source electrode 50 is formed on the surface and the drain electrode 51 is formed on the backside. Thereby, the semiconductor device having the configuration shown in FIG. 1 is easily manufactured.

Figure 3:
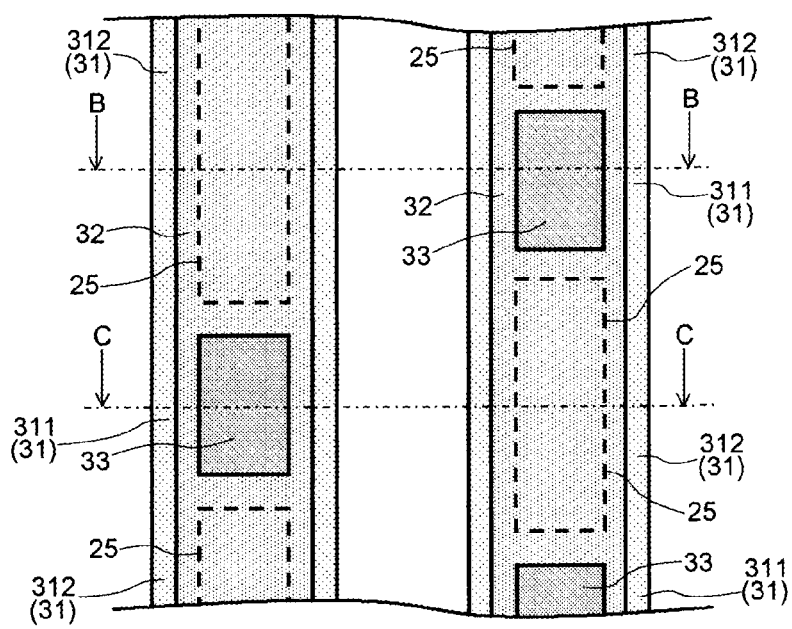
FIG. 3 is a plan view of a first modified embodiment of the semiconductor device according to the illustrative embodiment of this disclosure.

Meanwhile, in the above configuration, a configuration other than the configuration shown in FIG. 1 can be used for the recess 25 and the p$^+$-type layer 33. FIG. 3 is a plan view of a semiconductor device having this configuration (a first modified embodiment). A sectional view as seen in a B-B direction is the same as FIG. 1A, and a sectional view as seen in a C-C direction is a mirror-reversed shape of FIG. 1A.

In the configuration of FIG. 1, the recess 25 is continuously formed and the p$^+$-type layer 33 (the body-region-connecting region) is formed in parallel with the recess 25. In contrast, in the configuration of FIG. 3, the recess 25 and the p$^+$-type layer 33 are alternately formed. By this configuration, the contact parts to the n$^+$-type layer 32 and the p$^+$-type layer 33 (the p-type layer 31) are dispersed, so that it is possible to uniformly supply the current to the source electrode 50 and to uniformly make a potential distribution of the p-type layer 31. At this time, the sidewalls of the recess 25 are used to reduce the contact resistance to the n$^+$-type layer 32, which has been also described above. Also, the current path in the vertical direction in the n-type layer 22 is widened, which has been also described above.

Figure 4A:
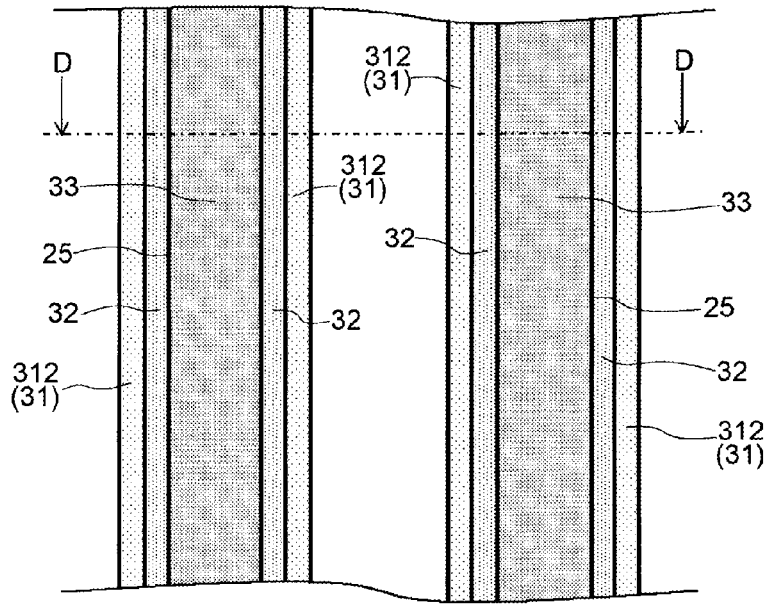
FIG. 4A is a plan view of a second modified embodiment of the semiconductor device according to the illustrative embodiment of this disclosure and FIG. 4B is a sectional view thereof.
Figure 4B:
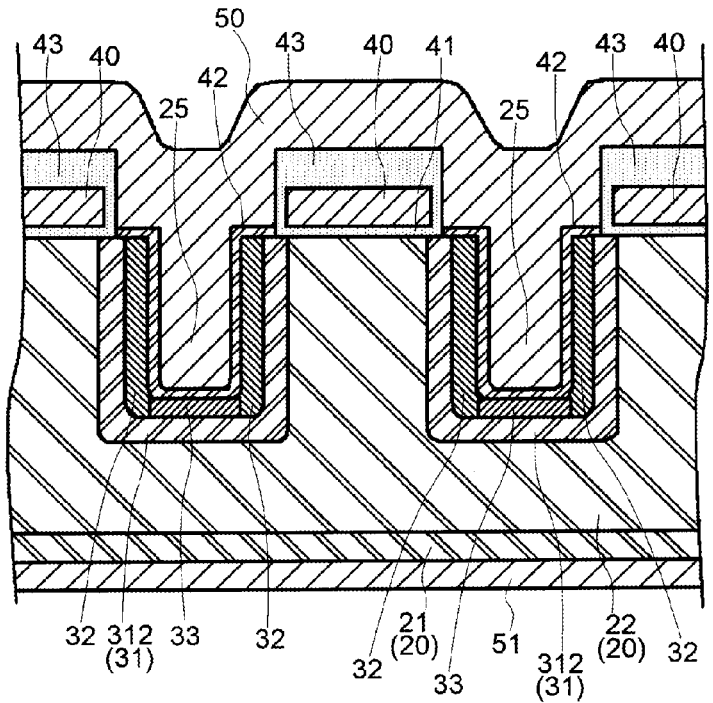

FIG. 4A is a plan view of a semiconductor device according to a second modified embodiment in which the recess 25 is formed at both sides of the gate electrode 40, and FIG. 4B is a sectional view thereof as seen in a D-D direction. In this configuration, the left and right structures of the gate electrode 40 are symmetrical. In this case, it is possible to increase the contact area of the source electrode 50 at both left and right sides of the gate electrode 40. Also, it is possible to increase a total area of the p+-type layer (the body-region-connecting region) 33. Therefore, it is possible to particularly reduce the contact resistance of the source electrode 50. However, this configuration is particularly effective when the resistance of the n-type layer 22 is sufficiently low during the operation, because the current path in the vertical direction in the n-type layer 22 is narrowed.

Figure 5A:
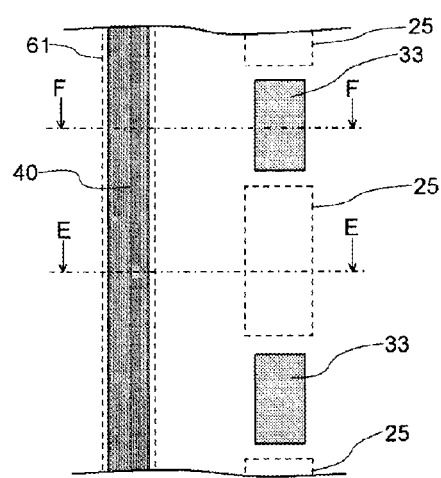
FIG. 5A is a plan view of a third modified embodiment of the semiconductor device according to the illustrative embodiment of this disclosure and FIGS. 5B and 5C are sectional views thereof.
Figure 5B:
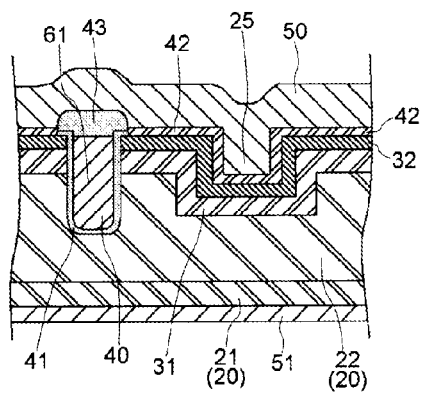
Figure 5C:
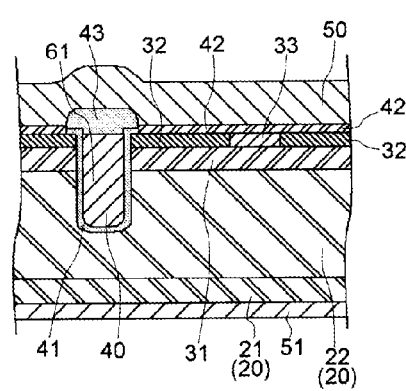

Also, all the above semiconductor devices are a planar gate type having a gate electrode formed on a surface. However, the same configuration can be also applied to a trench gate type having a gate electrode formed in a recess. FIG. 5A is a plan view of a semiconductor device having this configuration (a third modified embodiment), FIG. 5B is a sectional view as seen in an E-E direction, and FIG. 5C is a sectional view as seen in an F-F direction. In the plan view (FIG. 5A), the p-type layer 31, the n+-type layer 32, the source electrode 50 and the like are not shown. In this semiconductor device, a gate recess 61 is formed and the gate oxide film 41 and the gate electrode 40 are formed therein. The recess 25 is provided in parallel in the gate recess 61. Like the first modified embodiment, the recess 25 and the p+-type layer 33 are alternately formed, so that the same effects are accomplished. That is, it is possible to make the connection structure of the source region and the source electrode same in the trench gate type device as well as in the planar gate type device.

Figure 6:
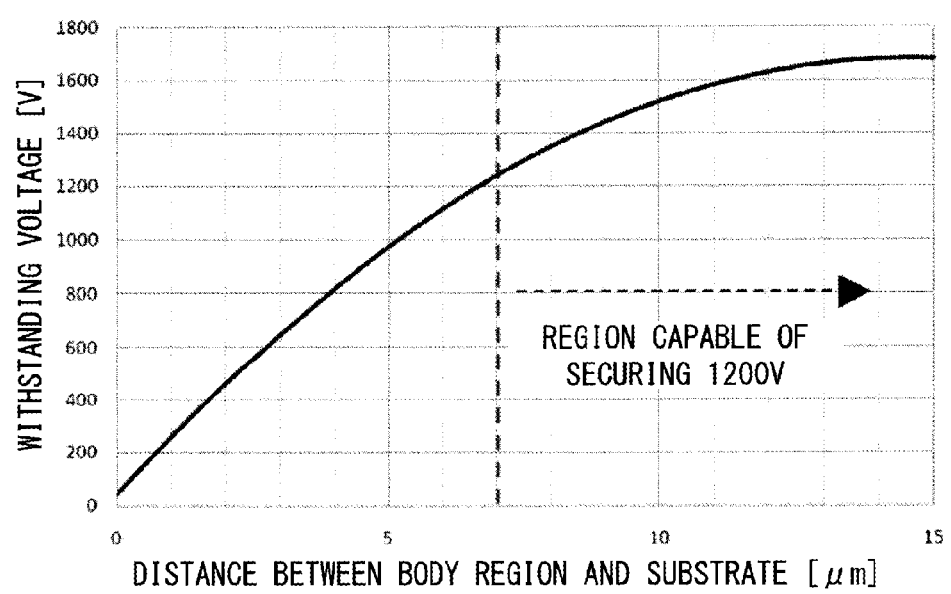
FIG. 6 is an example illustrating a relation of a distance between a p-type layer and an n+-type substrate and a withstanding voltage between a source and a drain.

In all the configurations, when the recess 25 is deeply formed, the contact resistance of the source electrode 50 is reduced. Also, since an interval between the p-type layer 31 (311) on the bottom surface of the recess 25 and the n+-type substrate 21 connected to the drain electrode 51 is narrowed, the withstanding voltage between the source and the drain is lowered. FIG. 6 is an example illustrating a relation of the distance between the p-type layer and the n+-type substrate and the withstanding voltage between the source and the drain, when the semiconductor substrate is made of SiC. From the result, it can be seen that the distance is preferably set to be about 7 μm or longer when it is necessary to secure the withstanding voltage of 1,200V or higher. For example, when the thickness of the n-type layer 22 is 11 μm and the thickness of the p-type layer 31 is 1 μm, a maximum depth of the recess 25 capable of securing the withstanding voltage of 1,200V is 3 μm.

In the above embodiments, the method of connecting the source electrode and the p-type layer is arbitrary. For example, in FIG. 1 and the like, instead of forming the p+-type layer 33, it may be possible to remove the n+-type layer 32 in the same region by the etching, thereby forming a contact with the p-type layer 31 (the body region). Also, in the above embodiments, the source region is an n-type (a first conductivity type) and the body region is a p-type (a second conductivity type). However, it is obvious that even when the conductivity type is opposite, it is possible to accomplish the same effects by the same configuration.

Also, in the above embodiments, the source electrode is connected to the semiconductor substrate through the silicide electrode. However, when it is possible to obtain the sufficiently low contact resistance even though the silicide electrode is not used, the silicide electrode is not required.

Meanwhile, in the above embodiments, the semiconductor device is a MOSFET (a power MOSFET). However, it is obvious that the same structure is also effective for a semiconductor device in which the same structure is used on a surface of a semiconductor substrate, for example, IGBT (Insulated Gate Bipolar Transistor).

What is claimed is:
1. A semiconductor device comprising:
a semiconductor substrate, a surface of the semiconductor substrate provided with:
a source region having a first conductivity type formed in a body region, the body region having a second conductivity type opposite to the first conductivity type;
a main electrode connected to the source region and the body region; and
a gate electrode, to which a voltage for controlling a current flowing through the main electrode is applied; and
a recess formed in the surface of the semiconductor substrate,
wherein the source region is exposed on an inner surface of the recess, and
wherein the body region and the source region are sequentially formed on the inner surface of the recess and the main electrode is connected to the source region at the inner surface of the recess.
2. The semiconductor device according to claim 1,
wherein a body-region-connecting region to which the body region and the main electrode are connected is provided at a position higher than a bottom surface of the recess.
3. The semiconductor device according to claim 2,
wherein the gate electrode extends in one direction on the surface of the semiconductor substrate, and
wherein the recess and the body-region-connecting region are alternately provided in a direction parallel with the gate electrode.
4. The semiconductor device according to claim 2,
wherein the gate electrode extends in an extending direction on the surface of the semiconductor substrate,
wherein the source region and the body region are formed on the surface of the semiconductor substrate on both sides, in a direction perpendicular to the extending direction, of the gate electrode, and
wherein the recess is formed at one side of the sides of the gate electrode in the direction perpendicular to the extending direction, and the main electrode is connected to the source region formed in the recess.
5. The semiconductor device according to claim 1,
wherein a body-region-connecting region to which the body region and the main electrode are connected is provided on a bottom surface of the recess.
6. The semiconductor device according to claim 1,
wherein the main electrode and at least one of the source region and the body region are connected to each other through a silicide electrode.

* * * * *